(12) United States Patent
Yoshida et al.

(10) Patent No.: US 7,868,623 B2
(45) Date of Patent: Jan. 11, 2011

(54) DETECTION CIRCUIT, PHYSICAL QUANTITY MEASUREMENT CIRCUIT, PHYSICAL QUANTITY MEASUREMENT DEVICE, AND ELECTRONIC INSTRUMENT

(75) Inventors: Naoki Yoshida, Suwa (JP); Masahiro Kanai, Suwa (JP); Eitaro Otsuka, Funabashi (JP)

(73) Assignee: Seiko Epson Corporation, Tokyo (JP)

( * ) Notice: Subject to any disclaimer, the term of this patent is extended or adjusted under 35 U.S.C. 154(b) by 417 days.

(21) Appl. No.: 12/155,383

(22) Filed: Jun. 3, 2008

(65) Prior Publication Data

US 2009/0013785 A1 Jan. 15, 2009

(30) Foreign Application Priority Data

Jun. 4, 2007 (JP) ............................. 2007-147721

(51) Int. Cl.
  *G01R 31/02* (2006.01)
  *G01P 15/10* (2006.01)
(52) U.S. Cl. .................... 324/537; 73/514.29
(58) Field of Classification Search ............... 324/537; 73/514.29
  See application file for complete search history.

(56) References Cited

U.S. PATENT DOCUMENTS 5,585,731 A  12/1996  Tsuchida et al.

| | | | |
|---|---|---|---|
| 6,316,955 B1 | 11/2001 | Shimamura et al. | |
| 6,624,405 B1 * | 9/2003 | Lau et al. | 250/214 LA |
| 2005/0129414 A1 * | 6/2005 | Guckenberger et al. | 398/202 |

FOREIGN PATENT DOCUMENTS

| JP | A-7-63511 | 3/1995 |
|---|---|---|
| JP | A-8-61958 | 3/1996 |
| JP | A-8-129046 | 5/1996 |
| JP | A-9-138141 | 5/1997 |
| JP | A-10-284707 | 10/1998 |
| JP | A-2001-160754 | 6/2001 |

* cited by examiner

*Primary Examiner*—Timothy J Dole
(74) *Attorney, Agent, or Firm*—Oliff & Berridge PLC

(57) ABSTRACT

A detection circuit includes a detection terminal to which an alternating current signal from a physical quantity transducer is input, a detection current/voltage conversion amplifier circuit that converts the alternating current signal input through the detection terminal into a voltage signal, an evaluation terminal that supplies an evaluation voltage signal to the detection current/voltage conversion amplifier circuit, an input resistor that has a given resistance ratio with respect to a feedback resistor; and a switch circuit of the detection circuit provided in a signal path that connects the evaluation terminal and an input node of the detection current/voltage conversion amplifier circuit.

16 Claims, 10 Drawing Sheets

FIG. 6

DETECTION CIRCUIT, PHYSICAL QUANTITY MEASUREMENT CIRCUIT, PHYSICAL QUANTITY MEASUREMENT DEVICE, AND ELECTRONIC INSTRUMENT

Japanese Patent Application No. 2007-147721 filed on Jun. 4, 2007, is hereby incorporated by reference in its entirety.

BACKGROUND OF THE INVENTION

The present invention relates to a detection circuit, a physical quantity measurement circuit, a physical quantity measurement device (e.g., vibrating gyroscope), an electronic instrument, and the like.

A detection circuit (sensor circuit) that receives a current (charge) signal corresponding to a change in physical quantity (e.g., angular velocity or acceleration) generated by a physical quantity transducer (i.e., a converter that converts a change in physical quantity into an electrical signal) must amplify the input current (charge) signal by a high amplification factor using a first-stage current/voltage conversion amplifier (hereinafter may be referred to as "I/V amplifier").

The detection sensitivity (S/N ratio) of the detection circuit (sensor circuit) is affected to a large extent by the performance of the first-stage I/V amplifier. Therefore, the manufacturer must elaborately evaluate the characteristics of the first-stage I/V amplifier in order to establish an appropriate design method. A product (detection circuit) with low detection sensitivity may be screened out based on the evaluation results.

Examples of the evaluation items for the first-stage I/V amplifier include whether or not the I/V amplifier functions as an amplifier circuit, whether or not the gain determined by the absolute value of a feedback resistor is an appropriate value, a check on the frequency characteristics of the I/V amplifier when the I/V amplifier includes a feedback resistor and a feedback capacitor (i.e., has frequency characteristics), and the like.

The following factor makes it difficult to evaluate the characteristics of the first-stage I/V amplifier. Specifically, since a current (charge) signal (alternating current) from a physical quantity transducer is very small, it is difficult to create an equivalent evaluation current signal when evaluating the first-stage I/V amplifier.

Therefore, when evaluating the characteristics of the first-stage I/V amplifier, it is necessary to employ a method in which an input resistor with a given resistance is connected to the first-stage I/V amplifier, and a voltage signal with a given amplitude is supplied to the input resistor.

The input evaluation voltage signal is converted into a small current signal (corresponding to an alternating current signal from a physical quantity transducer) through the input resistor. Therefore, the input evaluation voltage signal is a signal equivalent to the alternating current signal.

JP-A-9-138141 discloses a sensor circuit configured to convert a current detection signal into a voltage using a current/voltage conversion resistor, for example. In JP-A-9-138141, the current/voltage conversion resistor can be selectively connected to an input terminal of the sensor circuit. The resistor is connected/disconnected using an internal switch.

JP-A-8-61958 discloses a vibrating gyroscope inspection device, for example. In JP-A-8-61958, a vibrating gyroscope inspection signal (current signal) is input to a first-stage amplifier through an input resistor.

The inventors of the invention discovered the following problems.

(1) When connecting an external input resistor to an input terminal (pad) of a detection circuit (sensor circuit) when evaluating a first-stage I/V amplifier, the evaluation accuracy of the characteristics of the first-stage I/V amplifier decreases due to the addition of a parasitic capacitor of the external input resistor and a parasitic capacitor of a wire for connecting the external input resistor. In particular, since the resistance of a feedback resistor is increased in order to obtain a high gain, the first-stage I/V amplifier tends to be affected by the parasitic capacitor (i.e., the CR time constant changes due to the parasitic capacitor).

(2) Since an external resistor and a feedback resistor of a first-stage I/V amplifier are not produced by a common production process, a variation in resistance lacks consistency, whereby the resistance ratio (gain) tends to vary. This imposes limitations to the resistance of the external resistor and the value of the input voltage, thereby making it difficult to achieve a high gain (DC gain).

(3) An input resistor and a switch that switches the electrical connection of the input resistor may be provided in a detection circuit (sensor circuit). The input resistor may be connected to a first-stage I/V amplifier during evaluation, and may be disconnected during normal operation by operating the switch. In this case, since the switch is necessarily inserted in a normal signal input path of the first-stage I/V amplifier, a parasitic capacitor (and impedance) of the switch cannot be disregarded. Since the parasitic capacitor of the switch and the like vary depending on the detection circuit (sensor circuit), it may be impossible to ensure a highly accurate operation of the of first-stage I/V amplifier.

SUMMARY

According to one aspect of the invention, there is provided a detection circuit that detects an alternating current signal from a physical quantity transducer that converts a physical quantity into an electrical signal, the detection circuit comprising:

a detection terminal, the alternating current signal from the physical quantity transducer being input to the detection terminal;

a detection current/voltage conversion amplifier circuit that includes a feedback resistor and converts the alternating current signal input through the detection terminal into a voltage signal;

an evaluation terminal that supplies an evaluation voltage signal to the detection current/voltage conversion amplifier circuit;

an input resistor provided in a signal path that connects the evaluation terminal and an input node of the detection current/voltage conversion amplifier circuit, the input resistor having a given resistance ratio with respect to the feedback resistor; and a switch circuit of the detection circuit provided in the signal path that connects the evaluation terminal and the input node of the detection current/voltage conversion amplifier circuit, the switch circuit of the detection circuit electrically connecting the evaluation terminal and the input node of the detection current/voltage conversion amplifier circuit when the evaluation voltage signal is input to the evaluation terminal, and electrically disconnecting the evaluation terminal from the input node of the detection current/voltage conversion amplifier circuit when the alternating current signal is input to the detection terminal.

According to another aspect of the invention, there is provided a physical quantity measurement circuit that detects an alternating current signal relating to a physical quantity to be measured to measure the physical quantity, the alternating current signal being output from a physical quantity transducer, the physical quantity measurement circuit comprising:

the above detection circuit; and an oscillation driver circuit that forms an oscillation loop when the physical quantity transducer is connected to the evaluation terminal, and causing the physical quantity transducer to produce driving vibrations via the oscillation loop.

According to another aspect of the invention, there is provided a physical quantity measurement device comprising:

the above a physical quantity measurement circuit; and at least one physical quantity transducer connected to the physical quantity measurement circuit.

According to another aspect of the invention, there is provided an electronic instrument comprising the above detection circuit.

According to another aspect of the invention, there is provided an electronic instrument comprising the above physical quantity measurement device.

BRIEF DESCRIPTION OF THE SEVERAL VIEWS OF THE DRAWING

FIG. 6 is a circuit diagram illustrative of an example of a physical quantity measurement circuit according to the invention (i.e., an example in which an evaluation terminal also serves as an input terminal for another signal).

DETAILED DESCRIPTION OF THE EMBODIMENT

Figure 1:
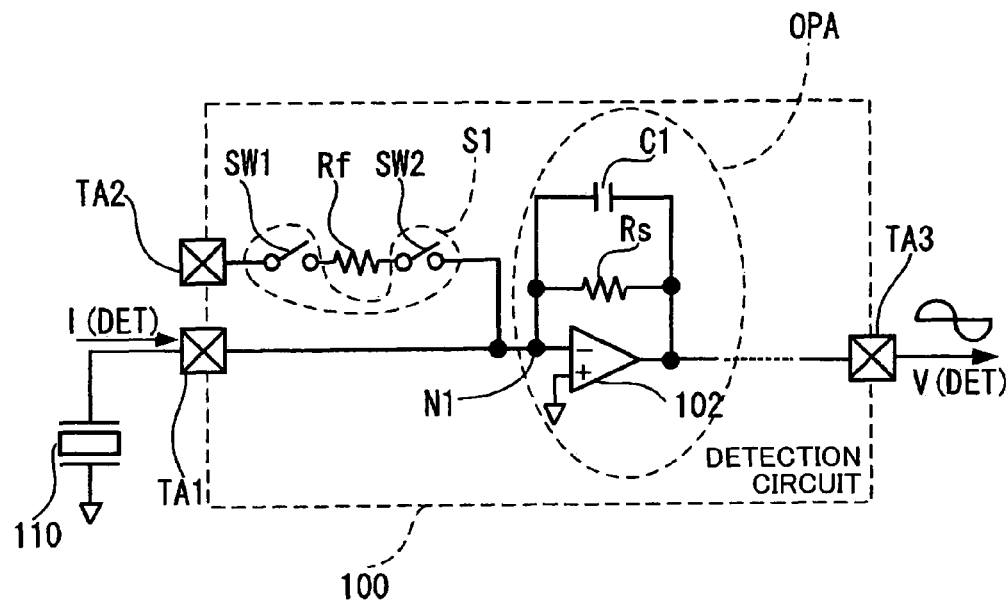
FIG. 1 is a circuit diagram illustrative of the configuration of an example of a detection circuit according to the invention and the operation of the detection circuit during normal operation.

Several embodiments of the invention may provide a detection circuit, a physical quantity measurement circuit, and the like that can evaluate (inspect) a first-stage I/V amplifier of a detection circuit (sensor circuit) with high accuracy and ensure a highly accurate operation during a normal operation state.

(1) According to one embodiment of the invention, there is provided a detection circuit that detects an alternating current signal from a physical quantity transducer that converts a physical quantity into an electrical signal, the detection circuit comprising:

a detection terminal, the alternating current signal from the physical quantity transducer being input to the detection terminal;

a detection current/voltage conversion amplifier circuit that includes a feedback resistor and converts the alternating current signal input through the detection terminal into a voltage signal;

an evaluation terminal that supplies an evaluation voltage signal to the detection current/voltage conversion amplifier circuit;

an input resistor provided in a signal path that connects the evaluation terminal and an input node of the detection current/voltage conversion amplifier circuit, the input resistor having a given resistance ratio with respect to the feedback resistor; and a switch circuit of the detection circuit provided in the signal path that connects the evaluation terminal and the input node of the detection current/voltage conversion amplifier circuit, the switch circuit of the detection circuit electrically connecting the evaluation terminal and the input node of the detection current/voltage conversion amplifier circuit when the evaluation voltage signal is input to the evaluation terminal, and electrically disconnecting the evaluation terminal from the input node of the detection current/voltage conversion amplifier circuit when the alternating current signal is input to the detection terminal.

The input resistor is provided in the detection circuit, and the evaluation terminal is provided in addition to the detection terminal. The evaluation voltage signal is supplied to the detection current/voltage conversion amplifier circuit (i.e., first-stage I/V amplifier) through the evaluation terminal and the input resistor during evaluation. The resistance ratio (Rs/Rf) of the input resistor and the feedback resistor of the detection current/voltage conversion amplifier circuit is set at a given value. The gain (direct-current gain) of the detection current/voltage conversion amplifier circuit is determined by the resistance ratio of the input resistor and the feedback resistor. The switch circuit of the detection circuit is provided in the signal path that connects the evaluation terminal and the detection current/voltage conversion amplifier circuit. The switch circuit of the detection circuit is turned ON during evaluation. The switch circuit of the detection circuit is turned OFF during normal operation to disconnect the input resistor from the detection current/voltage conversion amplifier circuit while preventing the input signal (i.e., the detection signal from the physical quantity transducer) during normal operation from leaking toward the evaluation terminal. Since a switch is not provided in a normal path that transmits the input signal (detection signal) during normal operation to the detection current/voltage conversion amplifier circuit, an adverse effect due to a parasitic capacitor and a parasitic impedance of the switch circuit of the detection circuit does not occur. Accordingly, a decrease in detection sensitivity (detection accuracy) of the detection circuit does not occur. Since the input resistor and the feedback resistor are provided in the detection circuit, the input resistor and the feedback resistor have consistent physical characteristic (e.g., temperature characteristics). Accordingly, the gain (direct-current gain) of the current/voltage conversion amplifier circuit can be kept constant even when the temperature has changed. This ensures a high evaluation accuracy.

(2) In the detection circuit, the detection current/voltage conversion amplifier circuit may include a feedback capacitor.

Specifically, the detection current/voltage conversion amplifier circuit includes the feedback capacitor in addition to the feedback resistor. The detection current/voltage conversion amplifier circuit has given frequency characteristics due to the feedback capacitor. This prevents oscillations by decreasing the gain in an unnecessary band, for example. Moreover, the phase of a signal in a given frequency band can be rotated in the detection current/voltage conversion amplifier circuit by a given amount by adjusting the resistance of the feedback resistor and the capacitance of the feedback capacitor.

(3) In the detection circuit, the feedback capacitor and the feedback resistor of the detection current/voltage conversion amplifier circuit may be connected in parallel so that the detection current/voltage conversion amplifier circuit has frequency characteristics of a low-pass filter.

Specifically, the detection current/voltage conversion amplifier circuit is an integral (low-pass filter type) amplifier circuit in which the feedback resistor and the feedback capacitor are connected in parallel. This prevents oscillations by decreasing the gain in a high band, for example. Moreover, the phase of a signal in a given frequency band can be rotated in the detection current/voltage conversion amplifier circuit by a given amount by adjusting the resistance of the feedback resistor and the capacitance of the feedback capacitor.

(4) In the detection circuit, the input resistor and the feedback resistor may be formed by an identical production step.

The input resistor and the feedback resistor are provided in the detection circuit. When incorporating the detection circuit in an IC, the input resistor and the feedback resistor are formed in an identical production step. Specifically, the input resistor and the feedback resistor are produced by common process technology using the same material (e.g., polysilicon). Therefore, the in-plane variation and the temperature characteristics of the IC wafer are identical. Accordingly, since the resistances of the input resistor and the feedback resistor change similarly even when the ambient temperature has changed, the gain (direct-current gain) of the detection current/voltage conversion amplifier circuit is kept constant. This ensures a high evaluation accuracy.

(5) In the detection circuit, the switch circuit of the detection circuit may include:

a switch element provided between the evaluation terminal and the input resistor; and a switch element provided between the input resistor and the input node of the detection current/voltage conversion amplifier circuit.

Specifically, the switch circuit of the detection circuit includes at least two switch elements provided on either side of the input resistor. When forming the switch elements using transistor switches (e.g., transfer gates), a signal leakage may occur between the detection terminal and the evaluation terminal through a parasitic capacitor even if the switch elements are turned OFF. Therefore, at least two switch elements are provided on either side of the input resistor in order to reliably prevent a signal leakage. Specifically, even if a signal leakage occurs through a parasitic capacitor of one switch element, the signal is attenuated by the input resistor and blocked by the subsequent switch element. Therefore, a signal leakage does not occur between the detection terminal and the evaluation terminal.

(6) In the detection circuit, the detection current/voltage conversion amplifier circuit may include a first current/voltage conversion amplifier and a second current/voltage conversion amplifier;

the detection circuit may include:

a first detection terminal and a second detection terminal, the alternating current signal being respectively input to the first current/voltage conversion amplifier and the second current/voltage conversion amplifier through the first detection terminal and the second detection terminal; and a differential amplifier that differentially amplifies signals output from the first current/voltage conversion amplifier and the second current/voltage conversion amplifier; and the switch circuit of the detection circuit may electrically connect the evaluation terminal and an input node of at least one of the first detection current/voltage conversion amplifier and the second detection current/voltage conversion amplifier when the evaluation voltage signal is input to the evaluation terminal, and may electrically connect the evaluation terminal and the input node of at least one of the first detection current/voltage conversion amplifier and the second detection current/voltage conversion amplifier when the alternating current signal is input to the evaluation terminal.

Specifically, the detection current/voltage conversion amplifier circuit includes the first current/voltage conversion amplifier and the second current/voltage conversion amplifier, the detection circuit includes the first detection terminal and the second detection terminal, the signals output from the first current/voltage conversion amplifier and the second current/voltage conversion amplifier are differentially amplified by the differential amplifier, and the evaluation terminal and the input node of each of the first detection current/voltage conversion amplifier and the second detection current/voltage conversion amplifier are electrically connected or disconnected using the switch circuit of the detection circuit. Unnecessary signals of the same phase contained in the signals input to the first detection terminal and the second detection terminal are canceled by the differential amplification operation. Therefore, the S/N ratio is improved. Moreover, the gain can be doubled by inputting the desired signals of opposite phases. It is also possible to evaluate only one of the first current/voltage conversion amplifier and the second current/voltage conversion amplifier or evaluate both of the first current/voltage conversion amplifier and the second current/voltage conversion amplifier by individually controlling the electrical connection between the evaluation terminal and the input nodes of the first current/voltage conversion amplifier and the second current/voltage conversion amplifier.

(7) In the detection circuit, the switch circuit of the detection circuit may include:

a switch element provided between the evaluation terminal and the input resistor;

a first switch element provided between the input resistor and the input node of the first current/voltage conversion amplifier; and a second switch element provided between the input resistor and the input node of the second current/voltage conversion amplifier.

Specifically, at least two switch elements are provided on either side of the input resistor in the same manner as in the embodiment described in (5) in order to reliably prevent a signal leakage. Specifically, even if a signal leakage occurs through a parasitic capacitor of one switch element, the signal is attenuated by the input resistor and blocked by the subsequent switch element. Therefore, a signal leakage does not occur between the detection terminal and the evaluation terminal.

(8) In the detection circuit,
the evaluation terminal may also serve as an input terminal that receives a signal other than the evaluation voltage signal.

Specifically, the evaluation terminal is not a dedicated terminal (terminal used only for evaluation), but is a general-purpose terminal also utilized for other applications. The evaluation voltage signal can be input to the detection circuit without increasing the number of terminals by utilizing the terminal used for other applications as the evaluation terminal.

(9) According to another embodiment of the invention, there is provided a physical quantity measurement circuit that detects an alternating current signal relating to a physical quantity to be measured to measure the physical quantity, the alternating current signal being output from a physical quantity transducer, the physical quantity measurement circuit comprising:

the detection circuit as described in (8); and
an oscillation driver circuit that forms an oscillation loop when the physical quantity transducer is connected to the evaluation terminal, and causing the physical quantity transducer to produce driving vibrations via the oscillation loop.

In the physical quantity measurement circuit according to this embodiment, the oscillation driver circuit is provided in addition to the detection circuit. The evaluation terminal also serves as an oscillation drive input terminal for causing the physical quantity transducer to oscillate. Therefore, the evaluation voltage signal can be input to the detection circuit without increasing the number of terminals. The physical quantity transducer (e.g., vibrating gyroscope) is connected to the oscillation drive input terminal during normal operation. An oscillation loop is thus formed, and the physical quantity transducer is caused to produce driving vibrations.

(10) In the physical quantity measurement circuit,
the oscillation driver circuit may include:
a drive current/voltage conversion amplifier circuit that includes a feedback resistor and converts an alternating current signal based on the driving vibrations of the physical quantity transducer input through the evaluation terminal into a voltage signal;
an input resistor provided in a signal path that connects the evaluation terminal and an input node of the drive current/voltage conversion amplifier circuit, the input resistor having a given resistance ratio with respect to the feedback resistor; and
a switch circuit of the oscillation driver circuit provided between the evaluation terminal and the input node of the drive current/voltage conversion amplifier.

The drive current/voltage conversion amplifier circuit provided in the oscillation driver circuit is also an evaluation target. Therefore, the switch circuit of the oscillation driver circuit is provided so that the signal path can be changed corresponding to evaluation/normal operation in the same manner as in the detection circuit. The drive current/voltage conversion amplifier circuit may be an amplifier circuit that includes a feedback capacitor and has given frequency characteristics (e.g., an integral amplifier circuit having low-pass filter characteristics).

(11) In the physical quantity measurement circuit,
the switch circuit of the oscillation driver circuit may include:
at least one switch element provided in a first signal path that connects the evaluation terminal and the input node of the drive current/voltage conversion amplifier circuit through the input resistor, the at least one switch element provided in the first signal path electrically connecting the evaluation terminal and the input node of the drive current/voltage conversion amplifier circuit when the evaluation voltage signal is input to the evaluation terminal, and electrically disconnecting the evaluation terminal from the input node of the drive current/voltage conversion amplifier circuit when the alternating current signal based on the driving vibrations is input to the evaluation terminal; and
at least one switch element provided in a second signal path that connects the evaluation terminal and the input node of the drive current/voltage conversion amplifier circuit without passing through the input resistor, the at least one switch element provided in the second signal path electrically disconnecting the evaluation terminal from the input node of the drive current/voltage conversion amplifier circuit when the evaluation voltage signal is input to the evaluation terminal, and electrically connecting the evaluation terminal and the input node of the drive current/voltage conversion amplifier circuit when the alternating current signal based on the driving vibrations is input to the evaluation terminal.

The driver circuit switch circuit is provided with a first signal path used during evaluation and a second signal path (i.e., a bypass path that bypasses the first signal path) used during normal operation. The switch elements for changing the signal path are respectively provided in the first signal path and the second signal path. Since the oscillation drive signal is input through the switch element provided in the second signal path during normal operation, an adverse effect due to a parasitic capacitor of the switch element necessarily occurs. On the other hand, since it suffices that the drive current/voltage conversion amplifier circuit have a gain that enables successive oscillations, a gain required for the drive current/voltage conversion amplifier circuit is significantly smaller than the gain of the detection current/voltage amplifier circuit which must amplify a small signal. Therefore, the actual operation is affected to only a small extent. Moreover, an AGC circuit (automatic gain control circuit) is generally provided in order to stabilize oscillations. In this case, a small change in gain is absorbed by a gain adjustment performed by the AGC circuit. Therefore, a configuration in which the oscillation drive signal is necessarily input through the switch element can be employed without causing problems.

(12) In the physical quantity measurement circuit,
the detection circuit may include a synchronous detection circuit that is provided in a subsequent stage of the detection current/voltage conversion amplifier circuit and performs a synchronous detection process using a synchronous detection reference signal from the oscillation driver circuit; and
when the evaluation voltage signal input to the evaluation terminal is supplied to the input node of the detection current/voltage conversion amplifier circuit through the switch circuit of the detection circuit, the oscillation driver circuit may generate the synchronous detection reference signal based on the evaluation voltage signal and may supply the synchronous detection reference signal to the synchronous detection circuit.

When the synchronous detection circuit that removes an unnecessary signal is provided in the subsequent stage of the detection circuit, the synchronous detection circuit must operate appropriately when evaluating the characteristics of the detection current/voltage conversion amplifier circuit. The synchronous detection circuit provided in the detection circuit performs the synchronous detection process using the synchronous detection reference signal supplied from the oscillation driver circuit. When the evaluation terminal also serves as the oscillation drive input terminal, the synchronous detection circuit is driven at an appropriate timing by inputting the evaluation voltage signal (alternating-current signal with a given frequency) to the evaluation terminal. Therefore, a very efficient evaluation can be achieved. Specifically, the input evaluation voltage signal is separately transmitted in two systems through the switch circuit of the oscillation driver circuit and the switch circuit of the detection circuit. One of the signals is amplified by the detection current/voltage conversion amplifier circuit, and then input to the synchronous detection circuit. The other signal is amplified by the drive current/voltage conversion amplifier circuit. The synchronous detection reference signal is generated based on the amplified signal, and is supplied to the synchronous detection circuit. Since the signal input to the synchronous detection circuit and the synchronous detection reference signal are generated based on the common signal input through the evaluation terminal, these signals are synchronized. Therefore, the synchronous detection circuit operates at an appropriate timing to obtain a detection output. The detection voltage/current conversion amplifier circuit can be evaluated by analyzing the detection output. The drive current/voltage conversion amplifier circuit can be also be evaluated by supplying the signal transmitted through the drive current/voltage conversion amplifier circuit to the outside of the physical quantity measurement circuit and analyzing the signal.

(13) According to another embodiment of the invention, there is provided a physical quantity measurement device comprising:

one of the above physical quantity measurement circuits; and at least one physical quantity transducer connected to the physical quantity measurement circuit.

The physical quantity measurement circuit has been evaluated in advance to have a low-noise performance, for example. Therefore, the physical quantity measurement device connected to the physical quantity transducer has high accuracy and high detection performance.

(14) In the physical quantity measurement device, the physical quantity measurement device may be a gyrosensor that utilizes a vibrating gyroscope as the physical quantity transducer.

A high-performance gyrosensor (physical quantity measurement device) can be thus obtained.

(15) According to another embodiment of the invention, there is provided an electronic instrument comprising one of the above detection circuits.

One of the above detection circuits has been evaluated in advance to have a low-noise performance, for example. Therefore, an electronic instrument including the detection circuit according to the invention can detect a physical quantity with high accuracy. This improves the performance of the electronic instrument.

(16) According to another embodiment of the invention, there is provided an electronic instrument comprising one of the above physical quantity measurement devices.

One of the above physical quantity measurement devices has been evaluated in advance to have a low-noise performance, for example. Therefore, an electronic instrument including the above physical quantity measurement device can detect a physical quantity with high accuracy. This improves the performance of the electronic instrument.

As described above, several embodiments of the invention can provide a detection circuit, a physical quantity measurement circuit, and the like that can evaluate (inspect) a first-stage I/V amplifier of a detection circuit (sensor circuit) with high accuracy and ensure a highly accurate operation during a normal operation state.

Figure 11A:
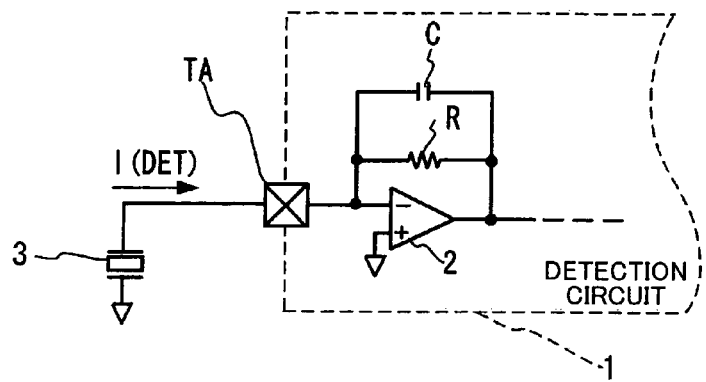
FIGS. 11A to 11C are views illustrative of a comparative example.
Figure 11B:
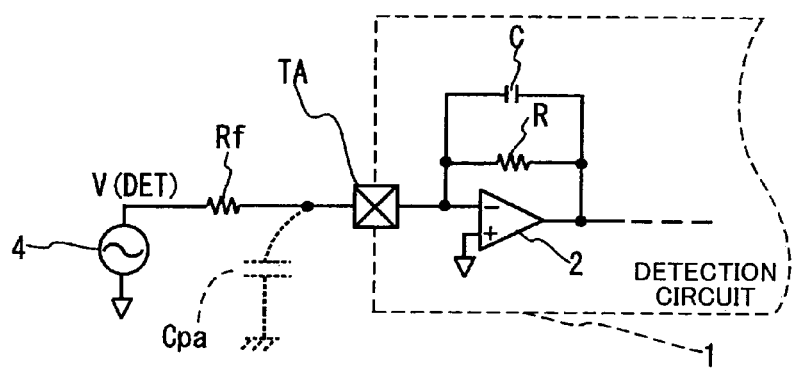
Figure 11C:
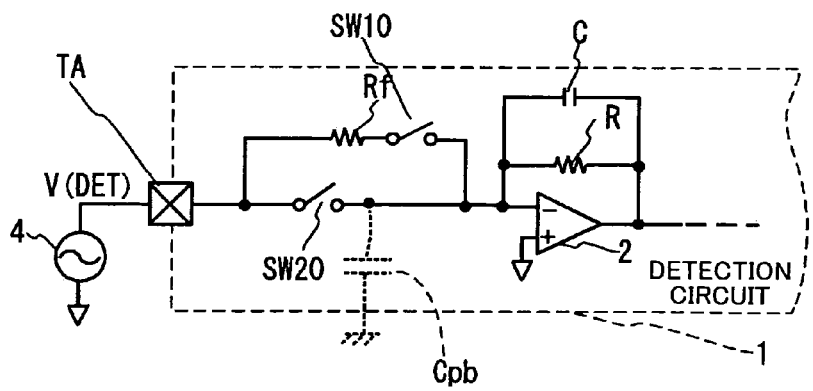

A comparative example for demonstrating the features of the invention is briefly described below before describing this embodiment. FIGS. 11A to 11C are views illustrative of a comparative example for demonstrating the features of the invention.

As shown in FIG. 11A, a detection circuit 1 includes a first-stage current/voltage conversion amplifier circuit (I/V amplifier) 2 that includes a feedback resistor R and a feedback capacitor C. During normal operation, a current (charge) signal (I(DET)) from a physical quantity transducer 3 is input to the I/V amplifier 2 through a detection terminal (TA).

As shown in FIG. 11B, when evaluating the first-stage I/V amplifier 2, an evaluation voltage signal (V(DET)) is input through an external input resistor Rf. Specifically, since the current (charge) signal (alternating current) from the physical quantity transducer is very small, it is difficult to create an equivalent evaluation current signal when evaluating the first-stage I/V amplifier 2.

In this case, the evaluation accuracy of the characteristics of the first-stage I/V amplifier 2 decreases due to the addition of a parasitic capacitor Cpa of the external resistor Rf and a parasitic capacitor of a wire for connecting the external resistor Rf.

In particular, since the resistance of the feedback resistor Rf is increased in order to obtain a high gain, the first-stage I/V amplifier 2 tends to be affected by the parasitic capacitor (i.e., the CR time constant changes due to the parasitic capacitor).

Examples of the evaluation items of the first-stage I/V amplifier 2 include whether or not the I/V amplifier 2 functions as an amplifier, whether or not the gain determined by the absolute value of the feedback resistor R is an appropriate value, a check on the frequency characteristics of the I/V amplifier 2, and the like.

In FIG. 11C, the input resistor Rf is provided in the detection circuit 1. A switch SW10 and a switch SW20 are also provided in the detection circuit 1. A signal path is changed by causing the switch SW10 to be turned ON during normal operation and causing the switch SW20 to be turned ON during evaluation.

In FIG. 11C, since the switch SW20 is necessarily inserted in a normal signal input path of the first-stage I/V amplifier 2, a parasitic capacitor Cpb (and the impedance) of the switch SW20 cannot be disregarded. Since the parasitic capacitor of the switch SW20 and the like vary depending the detection circuit (sensor circuit), it is difficult to ensure a highly accurate operation of the first-stage I/V amplifier 2.

According to embodiments of the invention which solve such a problem, an input resistor is provided in a detection circuit. An evaluation terminal is provided in addition to a detection terminal, and an evaluation voltage signal is input through the evaluation terminal. A switch that changes a signal path is not provided in a signal path to which a detection signal is input.

The embodiments of the invention are described in detail below with reference to the drawings. Note that the embodiments described below do not in any way limit the scope of the invention defined by the claims laid out herein. Note that all elements of the embodiments described below should not necessarily be taken as essential requirements for the invention.

In the following description, a physical quantity is measured using a physical quantity transducer. The measurement target physical quantity may be an angular velocity, acceleration, angular acceleration, or the like.

Examples of the material for the physical quantity transducer include a constant modulus alloy such as elinvar and a ferroelectric single crystal (piezoelectric single crystal). Examples of such a single crystal include a rock crystal, lithium niobate, lithium tantalate, a lithium niobate-lithium tantalate solid solution, lithium borate, and langasite. It is preferable that the physical quantity transducer be hermetically sealed in a package. It is preferable that the package be filled with dry nitrogen or be under vacuum.

First Embodiment

FIG. 1 is a circuit diagram illustrative of the configuration of an example of a detection circuit according to the invention and the operation of the detection circuit during normal operation.

A detection circuit 100 includes a detection terminal (TA 1), an evaluation terminal (TA2), an output terminal (TA3), a detection current/voltage conversion amplifier circuit (OPA) formed of an operational amplifier 102 that includes a feedback resistor Rs and a feedback capacitor C1, an input resistor Rf, and a switch circuit of the detection circuit S1, the input resistor Rf and the switch circuit of the detection circuit S1 being provided between the evaluation terminal (TA2) and an input node N1 of the detection current/voltage conversion amplifier circuit (OPA).

The switch circuit of the detection circuit S1 includes at least one switch element (SW1 and SW2). The switch elements (SW1 and SW2) are transistor switches such as transfer gates, for example.

Since the evaluation terminal (TA2) is provided in addition to the detection terminal (TA1), an evaluation voltage signal can be input through a signal path differing from a signal path during normal operation.

The switch circuit of the detection circuit S1 is set in an open (OFF) state during normal operation to electrically disconnect the evaluation terminal (TA2) from the input node N1 of the detection current/voltage conversion amplifier circuit (OPA). The switch circuit of the detection circuit S1 is set in a closed (ON) state during evaluation to electrically connect the evaluation terminal (TA2) and the input node N1 of the detection current/voltage conversion amplifier circuit (OPA).

As shown in FIG. 1, the switch circuit of the detection circuit S1 is provided in a path that connects the evaluation terminal (TA2) and the input node N1 of the detection current/voltage conversion amplifier circuit (OPA) instead of a normal signal path (path that connects the detection terminal (TA1) and the input node N1 of the detection current/voltage conversion amplifier circuit (OPA)). Therefore, an adverse effect due to a parasitic capacitor and a parasitic impedance of the switch circuit of the detection circuit S1 does not occur during normal operation. Accordingly, a decrease in detection sensitivity (detection accuracy) of the detection circuit does not occur.

It suffices that the switch circuit of the detection circuit S1 include at least one switch element. In FIG. 1, the switch circuit of the detection circuit S1 includes two switch elements (SW1 and SW2). These switch elements are provided on either side of the input resistor. The reason therefor is as follows.

When forming the switch elements (SW1 and SW2) using transistor switches (e.g., transfer gates), a signal leakage may occur between the detection terminal (TA1) and the evaluation terminal (TA2) through a parasitic capacitor even if the switch elements (SW1 and SW2) are turned OFF. Therefore, at least two switch elements (SW1 and SW2) are provided on either side of the input resistor (Rf) in order to reliably prevent a signal leakage. Specifically, even if a signal leakage occurs through a parasitic capacitor of one switch element (e.g., SW2), the signal is attenuated by the input resistor (Rf) and blocked by the subsequent switch element (SW1). Therefore, a signal leakage does not occur between the detection terminal (TA1) and the evaluation terminal (TA2).

The switch circuit of the detection circuit S1 is opened and closed using a switch control circuit (not shown) provided in the detection circuit 100, for example. For example, the switch is turned ON/OFF by inputting a switch control signal from an IC tester (e.g., FFT analyzer) to the switch control circuit (not shown) through another terminal (not shown).

The input resistor Rs is used only during evaluation. The resistance ratio (Rs/Rf) of the input resistor Rf and the feedback resistor Rs is set at a given value. The gain (direct-current gain) of the detection current/voltage conversion amplifier circuit (OPA) is determined by the resistance ratio (Rs/Rf) of the input resistor Rf and the feedback resistor Rs.

The input resistor Rs is provided in the detection circuit 100. The physical characteristics of the input resistor Rf are consistent with those of the feedback resistor Rs of the detection current/voltage conversion amplifier circuit (OPA). When incorporating the detection circuit 100 in an IC, the input resistor Rf and the feedback resistor Rs are formed in an identical production step. Specifically, the input resistor Rf and the feedback resistor Rs are produced by common process technology using the same material (e.g., polysilicon). Therefore, the in-plane variation and the temperature characteristics of the IC wafer are identical. Accordingly, since the resistances of the input resistor and the feedback resistor change similarly even when the ambient temperature has changed, the gain (direct-current gain) of the detection current/voltage conversion amplifier circuit is kept constant. This ensures a high evaluation accuracy.

The gain of the detection current/voltage conversion amplifier circuit (OPA) is set at a high value so that a small current signal can be converted into a voltage signal with a desired amplitude. The feedback resistor Rs is formed of polysilicon, for example. The resistance of the feedback resistor Rs is set at 10 MΩ to 1 GΩ, for example.

The feedback capacitor C1 has an oscillation prevention function. Specifically, the detection current/voltage conversion amplifier circuit (OPA) shown in FIG. 1 is an integral (low-pass filter type) amplifier circuit in which the feedback resistor Rs and the feedback capacitor C1 are connected in parallel. An oscillation is reliably prevented by decreasing the high gain.

Note that a configuration in which the feedback capacitor C1 is not provided (i.e., configuration that does not positively provide frequency characteristics) is also intended to be included within the scope of the invention. The phase of an input signal (I(DET)) with a given frequency may be rotated by a given amount by adjusting the capacitance of the feedback capacitor C1 and the resistance of the feedback resistor Rs. Such a configuration is also intended to be included within the scope of the invention.

The switch elements (SW1 and SW2) included in the switch circuit of the detection circuit S1 are turned OFF during normal operation.

During normal operation, an alternating current (charge) signal (I(DET): the frequency is several tens to several hundreds of hertz, for example) corresponding to a change in physical quantity output from the physical quantity transducer is input to the detection circuit 100 through the detection terminal (TA1).

The detection current/voltage conversion amplifier circuit (OPA) converts the alternating current (charge) signal (I(DET)) input to the detection circuit 100 into a voltage signal, and amplifies the voltage signal. A voltage signal (V(DET)) that indicates a change in physical quantity is output from the output terminal (TA3) of the detection circuit 100.

Figure 2:
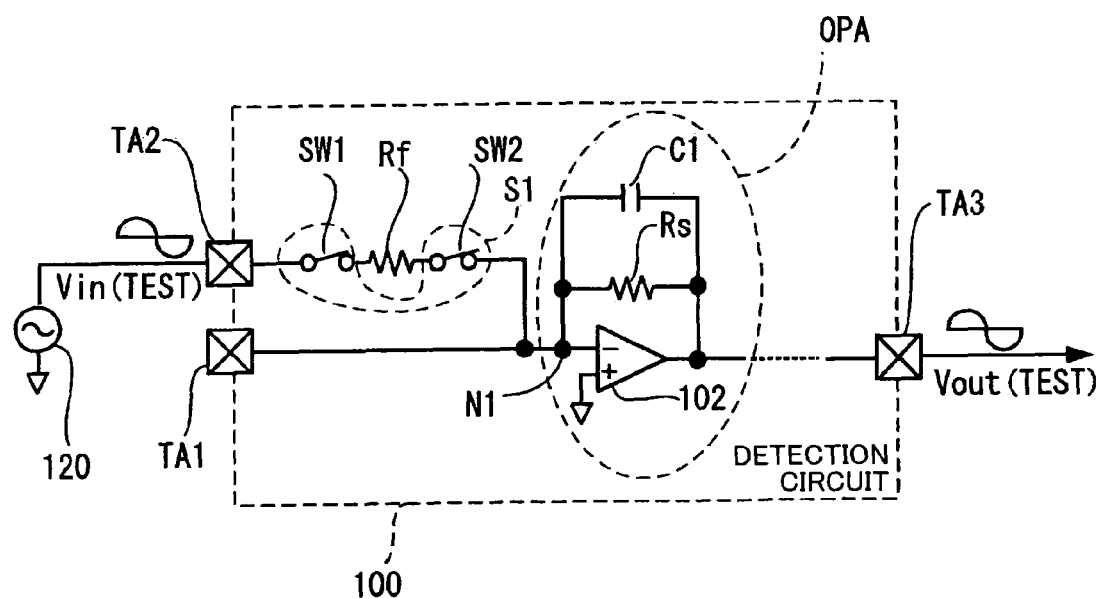
FIG. 2 is a circuit diagram illustrative of the operation of the detection circuit shown in FIG. 1 during evaluation.

FIG. 2 is a circuit diagram illustrative of the configuration of an example of the detection circuit according to the invention and the operation of the detection circuit during evaluation. In FIG. 2, the same sections as in FIG. 1 are indicated by the same reference symbols.

The switch elements (SW1 and SW2) included in the switch circuit of the detection circuit S1 are set in a closed (ON) state during evaluation. A signal path for supplying an evaluation voltage signal (Vin(TEST)) to the detection current/voltage conversion amplifier circuit (OPA) is thus formed.

The evaluation voltage signal (Vin(TEST)) is a signal equivalent to the alternating current signal (I(DET)) input from a physical quantity transducer 110 during normal operation. The gain (direct-current gain) of the detection current/voltage conversion amplifier circuit (OPA) is determined by the resistance ratio Rs/Rf, as described above. Since the resistors (Rs and Rf) have consistent physical characteristics (e.g., temperature characteristics), the gain is kept constant even if the ambient temperature has changed.

The performance of the detection current/voltage conversion amplifier circuit (OPA) can be evaluated by observing and analyzing an evaluation output signal (Vout(TEST)) obtained from the output terminal (TA3).

Examples of the evaluation items include whether or not the detection current/voltage conversion amplifier circuit (OPA) functions as an amplifier circuit, whether or not the gain determined by the absolute value of the feedback resistor Rs is an appropriate value, a check on the frequency characteristics of the detection current/voltage conversion amplifier circuit (OPA), and the like.

When the parasitic capacitors (Cpa and Cpb) shown in FIGS. 11B and 11C are present, the evaluation accuracy may decrease due to an error in the measurement signal. On the other hand, the detection circuit 100 shown in FIG. 1 includes the input resistor, and a switch is not provided in the normal signal path. Therefore, an adverse effect due to a parasitic capacitor and a parasitic impedance of the switch does not occur. This prevents a decrease in detection sensitivity (detection accuracy) of the detection circuit.

Moreover, since the input resistor (Rf) and the feedback resistor (Rs) are provided in the detection circuit 100, the input resistor (Rf) and the feedback resistor (Rs) have consistent physical characteristics (e.g., temperature characteristics). Accordingly, the gain (direct-current gain) of the detection current/voltage conversion amplifier circuit is kept constant even when the temperature has changed. This ensures a high evaluation accuracy.

Second Embodiment

Figure 3:
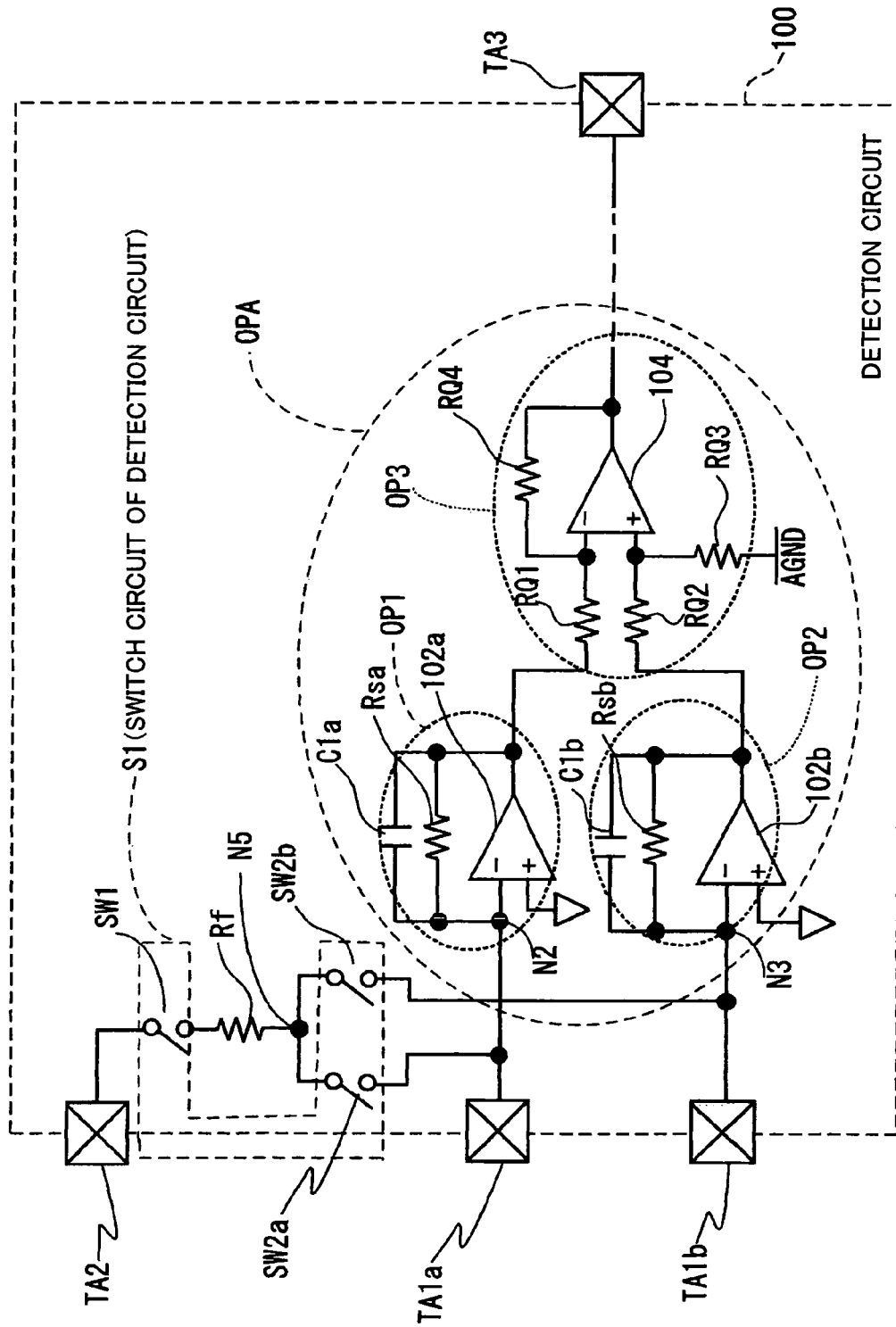
FIG. 3 is a circuit diagram showing the configuration of another example of the detection circuit according to the invention.

A second embodiment of the invention is described below with reference to FIGS. 3 to 5. FIG. 3 is a circuit diagram showing the configuration of another example of the detection circuit according to the invention.

The circuit configuration shown in FIG. 3 is characterized in that the detection current/voltage conversion amplifier circuit (OPA) has a differential configuration, and the configuration of the switch circuit of the detection circuit S1 is changed correspondingly.

As shown in FIG. 3, the detection current/voltage conversion amplifier circuit (OPA) includes first and second current/voltage conversion amplifiers (OP1 and OP2).

The first detection current/voltage conversion amplifier (OP1) is formed of an operational amplifier 102*a* that includes a feedback resistor Rsa and a feedback capacitor C1*a*. The second detection current/voltage conversion amplifier (OP2) is formed of an operational amplifier 102*b* that includes a feedback resistor Rsb and a feedback capacitor C1*b*.

The detection circuit includes first and second detection terminals (TA1*a* and TA1*b*) for inputting alternating current signals (I(DET)) to the first and second current/voltage conversion amplifiers (OP1 and OP2), respectively. Alternating current signals of opposite phases are supplied to the first and second detection terminals (TA1*a* and TA1*b*) from the physical quantity transducer during normal operation.

The detection current/voltage conversion amplifier circuit (OPA) includes a differential amplifier (OP3) that differentially amplifies signals output from the first and second current/voltage conversion amplifiers (OP1 and OP2). The differential amplifier (OP3) includes an operational amplifier 104, input resistors (RQ1 and RQ2), a feedback resistor RQ4, and a resistor RQ3 provided between a non-inverting terminal and analog ground (AGND). The resistance ratio of the resistors RQ1 and RQ4 is set to be equal to the resistance ratio of the resistors RQ2 and RQ3.

Unnecessary signal components of the same phase contained in the alternating current signals (I(DET)) input to the first and second detection terminals (TA1*a* and TA1*b*) are canceled by the differential amplification operation. This improves the S/N ratio of the first-stage detection current/voltage conversion amplifier circuit (OPA). Moreover, the gain can be doubled by inputting the desired signals of opposite phases.

The switch circuit of the detection circuit S1 includes switch elements (SW2*a* and SW2*b*) provided corresponding to the first and second current/voltage conversion amplifiers (OP1 and OP2). The switch SW1 is provided in the same manner as in the above-described embodiment.

The open/closed state of the switch elements (SW1, SW2*a*, and SW2*b*) of the detection switch circuit S1 is classified into the following three states.

Specifically, the characteristics of only the first current/voltage conversion amplifier (OP1) can be evaluated by setting the switch elements SW1 and SW2*a* in a closed state (ON) and setting the switch element SW2*b* in an open state (OFF) so that the evaluation voltage signal (Vin(TEST)) is input to only the first current/voltage conversion amplifier (OP1).

Likewise, the characteristics of only the second current/voltage conversion amplifier (OP2) can be evaluated by setting the switch elements SW1 and SW2*b* in a closed state (ON) and setting the switch element SW2a in an open state (OFF) so that the evaluation voltage signal (Vin(TEST)) is input to only the second current/voltage conversion amplifier (OP2).

When a signal is output from only one of the first and second current/voltage conversion amplifiers OP1 and OP2, the output terminal of the other current/voltage conversion amplifier is set at analog ground (AGND). In this case, a signal with an amplitude half the amplitude of an output signal during normal operation is obtained from the differential amplifier (OP3).

The consistency (balance) of the characteristics of the first and second current/voltage conversion amplifiers (OP1 and OP2) can be evaluated by setting the switch elements SW1, SW2a, and SW2b in a closed state (ON) so that the evaluation voltage signal (Vin(TEST)) is input to the first and second current/voltage conversion amplifiers (OP1 and OP2). Specifically, when the characteristics of the first and second current/voltage conversion amplifiers OP1 and OP2 are balanced, the output node of the differential amplifier OP3 is set in a non-output state (state in which a given bias voltage is output). Therefore, when an offset occurs or an alternating-current component is observed, the characteristics of the first and second current/voltage conversion amplifiers OP1 and OP2 are not balanced.

It is possible to evaluate only one of the first and second current/voltage conversion amplifiers (OP1 and OP2) or evaluate both of the first and second current/voltage conversion amplifiers (OP1 and OP2) by individually controlling the electrical connection between the evaluation terminal (TA2) and input nodes (N2 and N3) of the first and second current/voltage conversion amplifiers (OP1 and OP2).

Moreover, a signal leakage can be reliably prevented by providing at least two switch elements (SW1 and SW2a or SW2b) on either side of the input resistor (Rf) in the same manner as in FIGS. 1 and 2. Specifically, even if a signal leakage occurs through a parasitic capacitor of one switch element (e.g., SW2a or SW2b), the signal is attenuated by the input resistor (Rf) and blocked by the subsequent switch element (SW1). Therefore, a signal leakage does not occur between the detection terminal (TA1) and the evaluation terminal (TA2).

Figure 4:
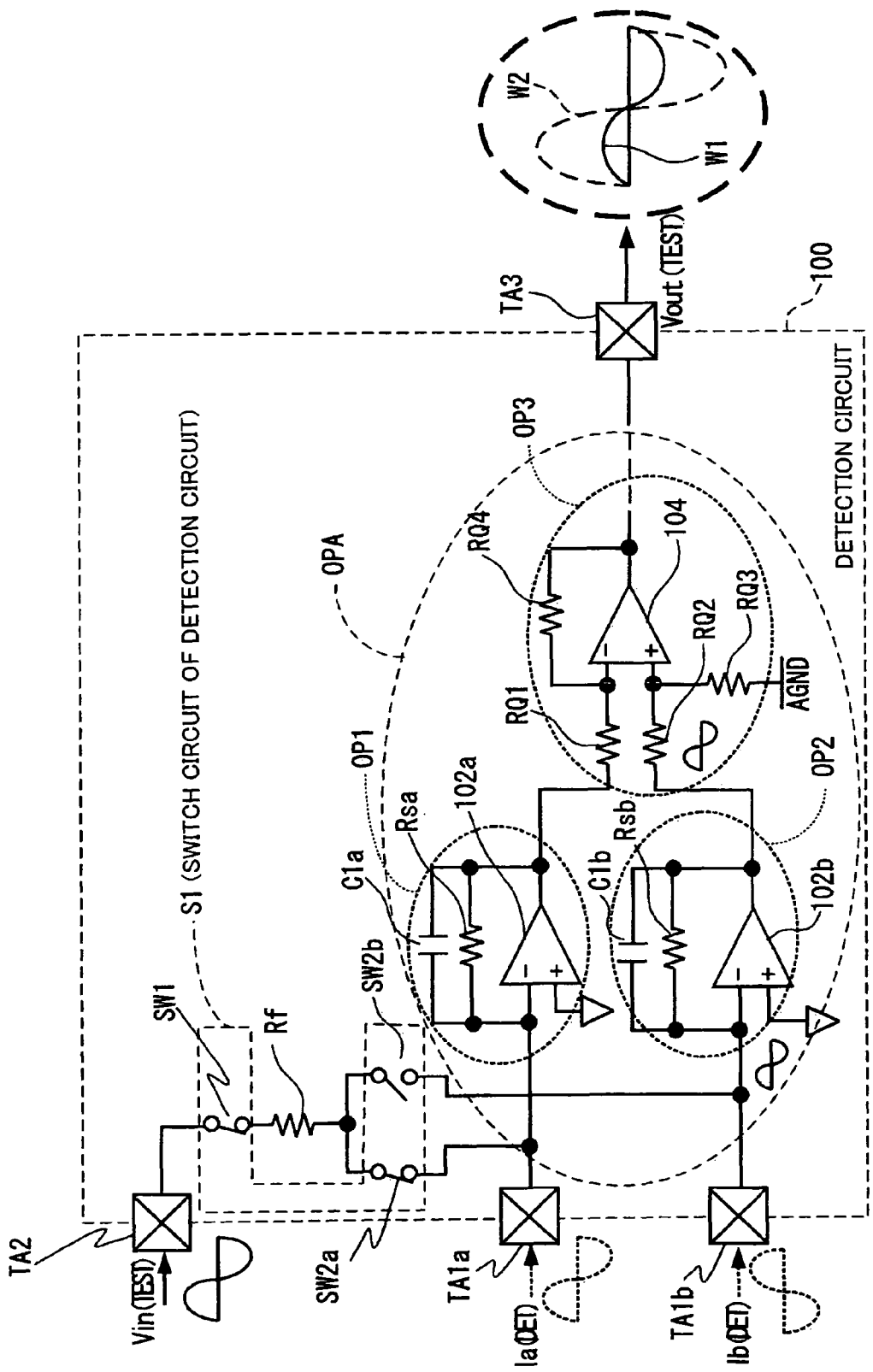
FIG. 4 is a view illustrative of an example of the operation of the detection circuit shown in FIG. 3 (i.e., the operation during normal operation and the operation when evaluating only one operation amplifier).

FIG. 4 is a view illustrative of an example of the operation of the detection circuit shown in FIG. 3 (operation during normal operation and operation when evaluating only one operation amplifier).

In FIG. 4, alternating current signals (Ia(DET) and Ib(DET): indicated by dotted lines) of opposite phases are input to the detection terminals (TA1a and TA1b) during normal operation.

The evaluation voltage signal (Vin(TEST)) is input to the evaluation terminal (TA2) during evaluation. In FIG. 4, the switch elements (SW1 and SW2a) are turned ON, and the switch element (SW2b) is turned OFF. Therefore, the evaluation voltage signal (Vin(TEST)) is input to only the first current/voltage conversion amplifier (OP1).

The evaluation output signal (Vout(TEST)) is obtained from the output terminal (TA3). Whether or not the first current/voltage conversion amplifier (OP1) operates as an amplifier can be evaluated by observing the evaluation output signal (Vout(TEST)) and checking the amplitude of the waveform (W1 and W2 in FIG. 4) of the evaluation output signal (Vout(TEST)). Moreover, whether or not the gain is in an appropriate range can also be evaluated. The frequency characteristics of the first current/voltage conversion amplifier (OP1) can be evaluated by changing the frequency of the evaluation voltage signal (Vin(TEST)), and observing and analyzing the waveform (W1 and W2) of the evaluation output signal (Vout(TEST)).

Likewise, the characteristics of the second current/voltage conversion amplifier (OP2) can be evaluated by causing the switch elements (SW1 and SW2b) to be turned ON and causing the switch element (SW2a) to be turned OFF.

Figure 5:
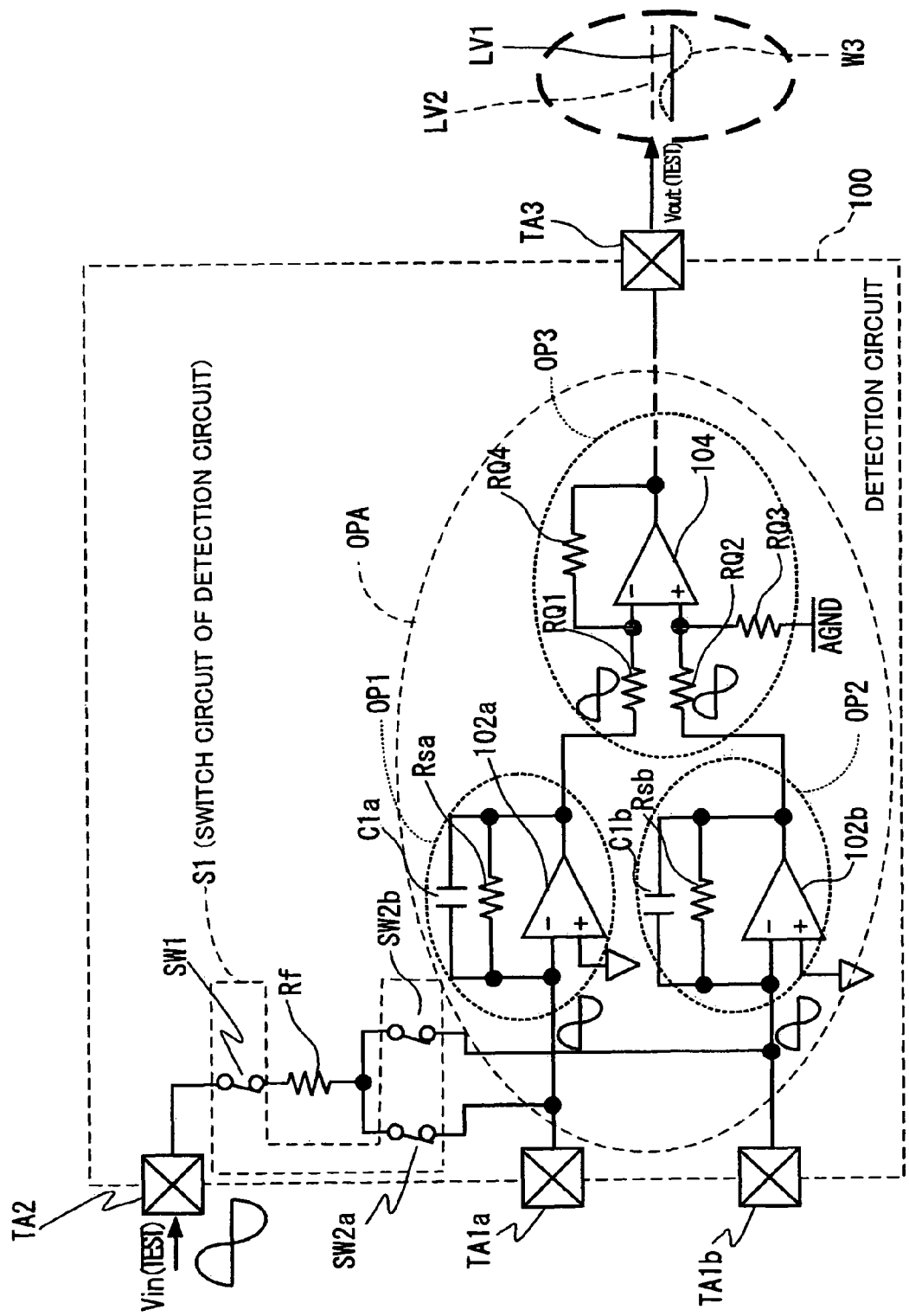
FIG. 5 is a view illustrative of another example of the operation of the detection circuit shown in FIG. 3 (i.e., the operation when evaluating the balance between two amplifiers).

FIG. 5 is a view illustrative of another example of the operation of the detection circuit shown in FIG. 3 (operation when evaluating the balance between two amplifiers).

In FIG. 5, the switch elements (SW1, SW2a, and SW2b) are turned ON. In this case, the evaluation voltage signal (Vin(TEST)) is input to the first and second current/voltage conversion amplifiers (OP1 and OP2). This makes it possible to evaluate the consistency (balance) of the characteristics of the first and second current/voltage conversion amplifiers (OP1 and OP2).

Specifically, when the first and second current/voltage conversion amplifiers OP1 and OP2 have identical characteristics, the output node of the differential amplifier (OP3) is set in a non-output state (state in which a given bias voltage is output).

Therefore, when the waveform of the evaluation output signal (Vout(TEST)) is checked and a given offset occurs with respect to the normal level (LV1) (i.e., a level LV2 is output) or an alternating-current waveform W3 is observed, it is determined that the characteristics of the first and second current/voltage conversion amplifiers (OP1 and OP2) are not balanced.

Third Embodiment

This embodiment illustrates a physical quantity measurement circuit including the detection circuit according to the invention. In the physical quantity measurement circuit according to this embodiment, the evaluation terminal also serves as an input terminal to which a signal other than the evaluation voltage signal (Vin(TEST)) is input.

Figure 6:
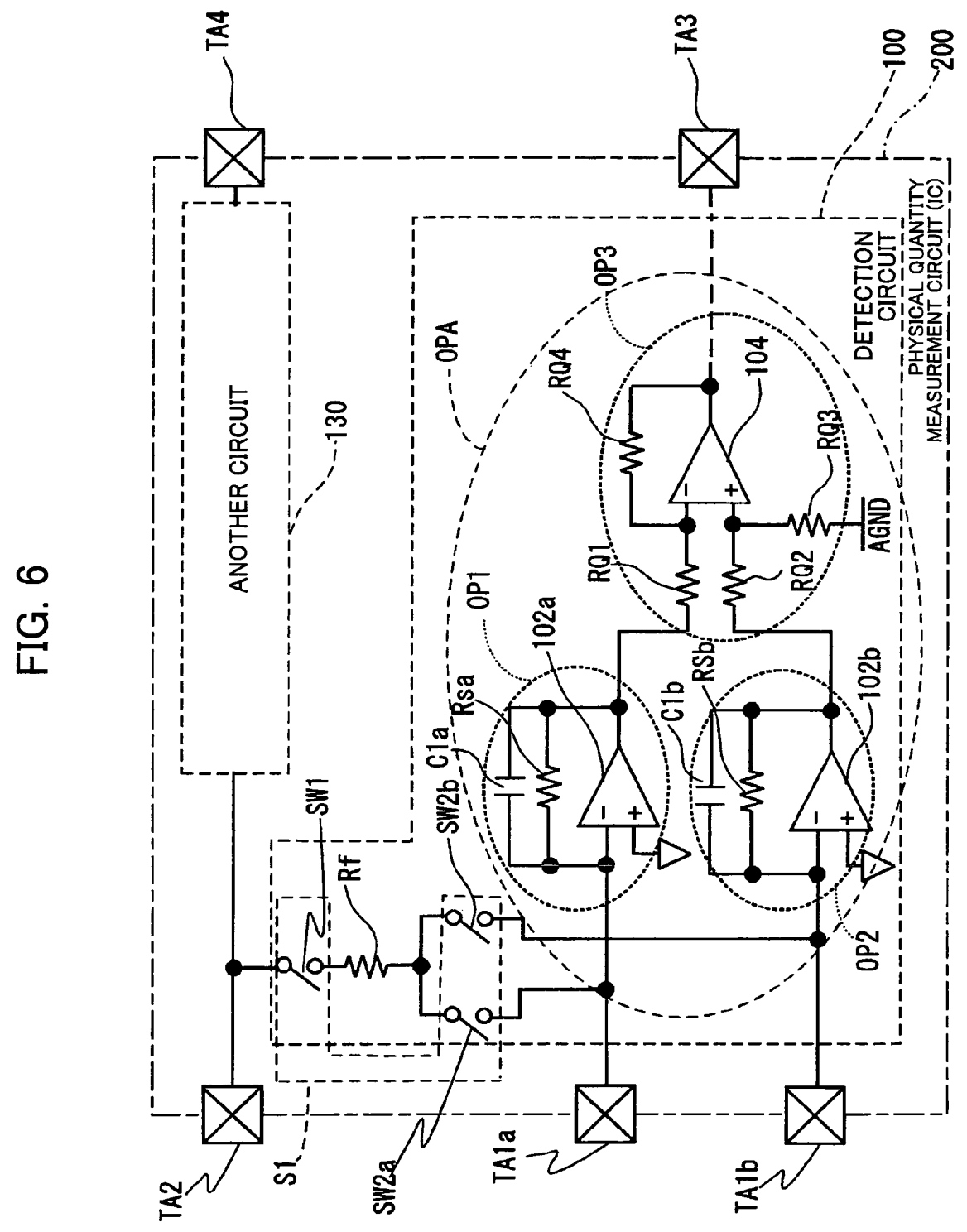

FIG. 6 is a circuit diagram illustrative of an example of the physical quantity measurement circuit according to the invention (example in which the evaluation terminal also serves as an input terminal for another signal).

A physical quantity measurement circuit (IC) 200 shown in FIG. 6 includes the detection circuit 100 according to the invention (having the same configuration as in FIGS. 3 to 5), and another circuit 130. The physical quantity measurement circuit 200 also includes an output terminal (TA4) for outputting a signal output from the circuit 130 to the outside.

As shown in FIG. 6, the evaluation terminal (TA2) also serves as a signal input terminal of the circuit 130. Specifically, the evaluation terminal (TA2) is not a dedicated terminal (terminal used only for evaluation), but is a general-purpose terminal also utilized for other applications.

The evaluation voltage signal can be input to the detection circuit without increasing the number of terminals by utilizing the terminal used for other applications as the evaluation terminal.

Fourth Embodiment

In this embodiment, a vibrating gyrosensor circuit (physical quantity measurement circuit) (and a vibrating gyrosensor (physical quantity measurement device)) is described with reference to FIGS. 7 to 9.

Figure 7:
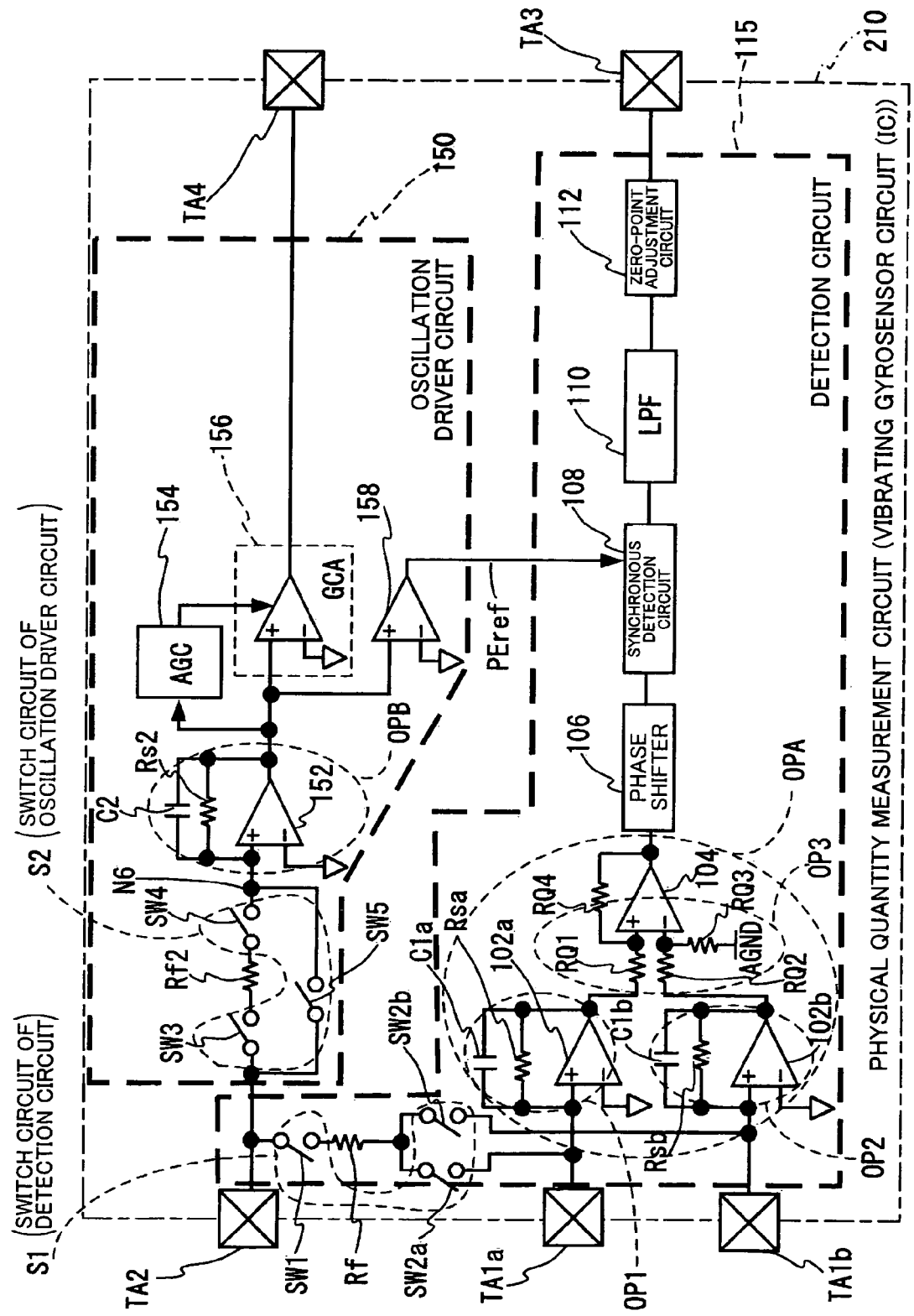
FIG. 7 is a circuit diagram illustrative of a vibrating gyrosensor circuit (physical quantity measurement circuit) (and a vibrating gyrosensor (physical quantity measurement device)).

FIG. 7 is a circuit diagram illustrative of a vibrating gyrosensor circuit (physical quantity measurement circuit) (and a vibrating gyrosensor (physical quantity measurement device)).

A vibrating gyrosensor circuit (physical quantity measurement circuit: IC) 210 shown in FIG. 7 includes a detection circuit 115 and an oscillation circuit 150.

The detection circuit 115 includes a detection current/voltage conversion amplifier circuit (OPA: having the configuration shown in FIGS. 3 to 5), a phase shifter 106, a synchronous detection circuit 108, a low-pass filter 110, and a zero-point adjustment circuit 112.

The oscillation driver circuit 150 includes a switch circuit of the oscillation driver circuit S2 (including switch elements SW3, SW4, and SW5), an input resistor Rf2, a drive current/voltage conversion amplifier circuit (OPB: including a feedback resistor Rs2, a feedback capacitor C2, and an operational amplifier 152), an AGC circuit 154, a gain control amplifier (GCA) 156, and a comparator (binarization circuit) 158 that generates a synchronous detection reference signal (PEref). The AGC circuit 154 is provided to maintain the gain in the oscillation loop at a desired value.

The drive current/voltage conversion amplifier circuit (OPB) included in the oscillation driver circuit 150 is also an evaluation target. Therefore, the switch elements (SW3 and SW4) of the switch circuit of the oscillation driver circuit S2 are turned ON and the switch element (SW5) is turned OFF during evaluation. In this case, a signal path that passes through the switch element (SW3), the input resistor Rf2, and the switch element (SW4) forms an evaluation first signal path.

The switch elements (SW3 and SW4) are turned OFF and the switch element (SW5) is turned ON during normal operation. A second signal path that bypasses the first signal path is formed by causing the switch element (SW5) to be turned ON. An oscillation drive signal is supplied to the drive current/voltage conversion amplifier circuit (OPB) through the second signal path.

Since the oscillation drive signal is input through the switch element (SW5) provided in the second signal path during normal operation, an adverse effect due to a parasitic capacitor of the switch element (SW5) necessarily occurs. On the other hand, since it suffices that the drive current/voltage conversion amplifier circuit (OPB) have a gain that enables successive oscillations, a gain required for the drive current/voltage conversion amplifier circuit (OPB) is significantly smaller than the gain of the detection current/voltage conversion amplifier circuit (OPA) which must amplify a small signal. Therefore, the actual operation is affected to only a small extent.

Moreover, since the AGC circuit (automatic gain control circuit) 154 is provided in order to stabilize oscillations, a small change in gain is absorbed by a gain adjustment performed by the AGC circuit 154. Therefore, a configuration in which the oscillation drive signal is necessarily input through the switch element (SW5) can be employed without causing problems.

In the vibrating gyrosensor circuit 210 shown in FIG. 7, the evaluation terminal (TA2) also serves as an oscillation drive input terminal for causing the vibrator (vibrating gyroscope) to oscillate. Therefore, the number of terminals can be reduced.

Figure 8:
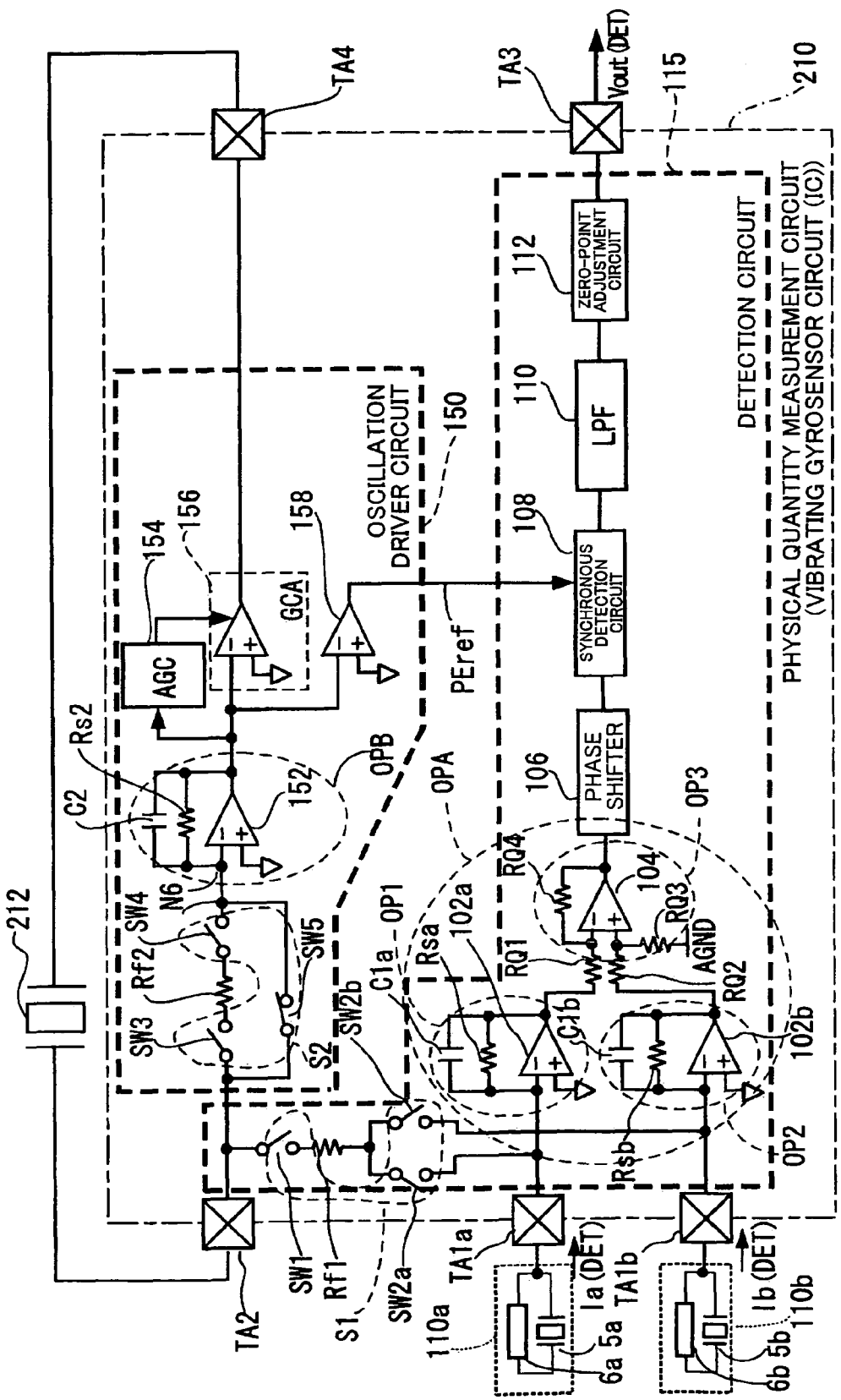
FIG. 8 is a circuit diagram illustrative of an example of the configuration (i.e., a configuration in which a vibrator is connected to a sensor circuit shown in FIG. 7) and the operation of a vibrating gyrosensor.

FIG. 8 is a circuit diagram illustrative of the configuration and the operation of a vibrating gyrosensor (a vibrator is connected to the sensor circuit shown in FIG. 7).

As shown in FIG. 8, the switch elements (SW1, SW2a, and SW2b) included in the switch circuit of the detection circuit (S1) are turned OFF during normal operation. In the switch circuit of the oscillation driver circuit S2, the switch element (SW5) is turned ON, and the switch elements (SW3 and SW4) are turned OFF.

A vibrator (e.g., crystal vibrator) 212 is connected to the evaluation terminal (TA2) of the vibrating gyrosensor circuit 210 during normal operation. An oscillation loop is thus formed by the oscillation driver circuit 150, and the vibrator 212 produces driving vibrations in a specific direction due to the oscillation loop.

The detection terminals (TA1a and TA1b) are respectively connected to detection vibrating gyroscopes (110a and 110b). The detection vibrating gyroscopes (110a and 110b) respectively include vibrators (5a and 5b: e.g., crystal vibrators) and oscillation driver circuits (6a and 6b) that cause the vibrators to oscillate.

The oscillation drive frequency of the oscillation driver circuit 150 is equal to the oscillation drive frequency of the detection vibrating gyroscopes (110a and 110b) (the oscillation frequency is referred to as fd).

When the detection vibrating gyroscopes (110a and 110b) rotate, alternating current signals (Ia(DET) and Ib(DET)) corresponding to the Coriolis force that occurs in the direction perpendicular to the driving vibrations due to rotation are generated. The alternating current signals (Ia(DET) and Ib(DET)) are respectively input to the detection terminals (TA1a and TA1b).

Note that a driving vibration component (unnecessary signal) is superimposed on the alternating current signals (Ia(DET) and Ib(DET)). Since the alternating current signals (Ia(DET) and Ib(DET)) occur perpendicularly to the driving vibrations, the phase of the alternating current signals (Ia(DET) and Ib(DET)) differs from the phase of the unnecessary signal (driving vibration component) by 90 degrees (the alternating current signals and the unnecessary signal have the drive frequency fd).

A synchronous detection process is performed in order to remove the unnecessary component. In the synchronous detection process, the comparator 158 of the oscillation driver circuit 150 generates a synchronous detection reference signal (REref) based on the signal (i.e., oscillation drive signal) in the oscillation loop. The synchronous detection reference signal (REref) is supplied to the synchronous detection circuit 108.

The synchronous detection process is performed under conditions whereby the frequency (fd) of the synchronous detection reference signal (REref) is equal to the frequency (fd) of the alternating current signals (Ia(DET) and Ib(DET)) input to the detection circuit 115, the phase of the synchronous detection reference signal (REref) is synchronized with the phase (fd) of the alternating current signals (Ia(DET) and Ib(DET)), and the phase of the unnecessary signal to be removed differs from the phase of the synchronous detection reference signal (REref) by 90 degrees.

The phase shifter 106 of the detection circuit 115 rotates the phase of the output signal from the detection current/voltage conversion amplifier circuit (OPA) by given degrees so that the above-mentioned phase conditions are satisfied. The phase shifter 106 rotates the phase of the signal having a frequency fd from the first-stage current/voltage conversion amplifiers (OP1 and OP2) by given degrees, if necessary. The oscillation driver circuit 150 also rotates the phase of the signal having a frequency fd from the drive current/voltage conversion amplifier circuit (OPB) by given degrees, if necessary.

When the synchronous detection process has been performed by the synchronous detection circuit 108, the desired signal (detection signal component) appears in the direct-current frequency band and the 2fd frequency band (fd refers to the frequency of the synchronous detection reference signal (REref)) (upper side band and lower side band), and the unnecessary signal (driving vibration leakage component) appears in the 2fd frequency band. Therefore, the desired signal (direct current) can be obtained by removing the component in the 2fd frequency band using the low-pass filter 110.

Figure 9:
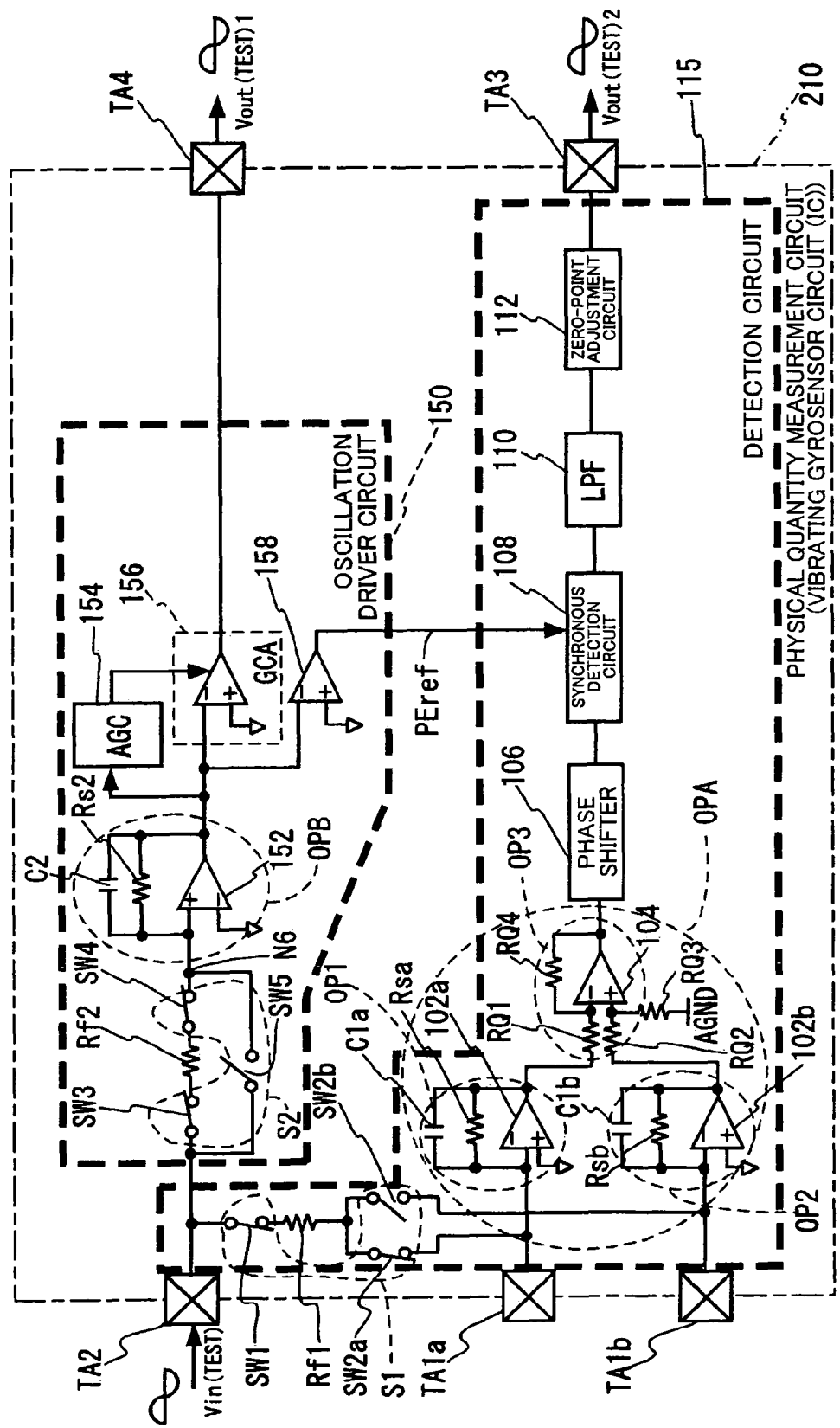
FIG. 9 is a circuit diagram illustrative of the operation of a vibrating gyrosensor circuit during evaluation.

FIG. 9 is a circuit diagram illustrative of the operation of the vibrating gyrosensor circuit during evaluation. As shown in FIG. 9, the switch elements (SW3 and SW4) of the switch circuit of the oscillation driver circuit (S2) are turned ON and the switch element (SW5) is turned OFF during evaluation.

In the switch circuit of the detection circuit (S1), the switch element (SW1) is turned ON and at least one of the switch elements (SW2a and SW2b) is turned ON, as described with reference to FIGS. 3 to 5. In FIG. 9, only the switch element (SW2a) is turned ON.

The input evaluation voltage signal (Vin(TEST)) is separately transmitted in two systems through the switch circuit of the oscillation driver circuit (S2) and the switch circuit of the detection circuit (S1).

One of the signals separately transmitted in the two systems is amplified by the detection current/voltage conversion amplifier circuit (OPA), and then input to the synchronous detection circuit (108). When a phase adjustment is necessary for the synchronous detection process, the phase shift of the phase shifter 106 is appropriately adjusted to a small extent, for example.

The other of the signals separately transmitted in the two systems is amplified by the drive current/voltage conversion amplifier circuit (OPB). The synchronous detection reference signal (PEref) is generated by the comparator 158 based on the amplified signal, and is supplied to the synchronous detection circuit 108.

Since the signal input to the synchronous detection circuit 108 and the synchronous detection reference signal (PEref) are generated based on the common signal input through the evaluation terminal (TA2), these signals are synchronized. Therefore, the synchronous detection circuit operates at an appropriate timing to obtain a detection output.

The characteristics of the drive current/voltage conversion amplifier circuit (OPB) can be evaluated (inspected) by observing and analyzing a signal obtained from the output terminal (TA4).

The synchronous detection process can be performed at an appropriate timing by inputting the common evaluation voltage signal (Vin(TEST)) to the evaluation terminal (TA2). Moreover, the detection circuit current/voltage conversion amplifier circuit (OPA) and the drive current/voltage conversion amplifier circuit (OPB) can be evaluated at the same time. Therefore, evaluations can be performed very efficiently.

Fifth Embodiment

This embodiment illustrates an electronic instrument including the physical quantity measurement device (and the detection circuit) according to the invention.

Figure 10:
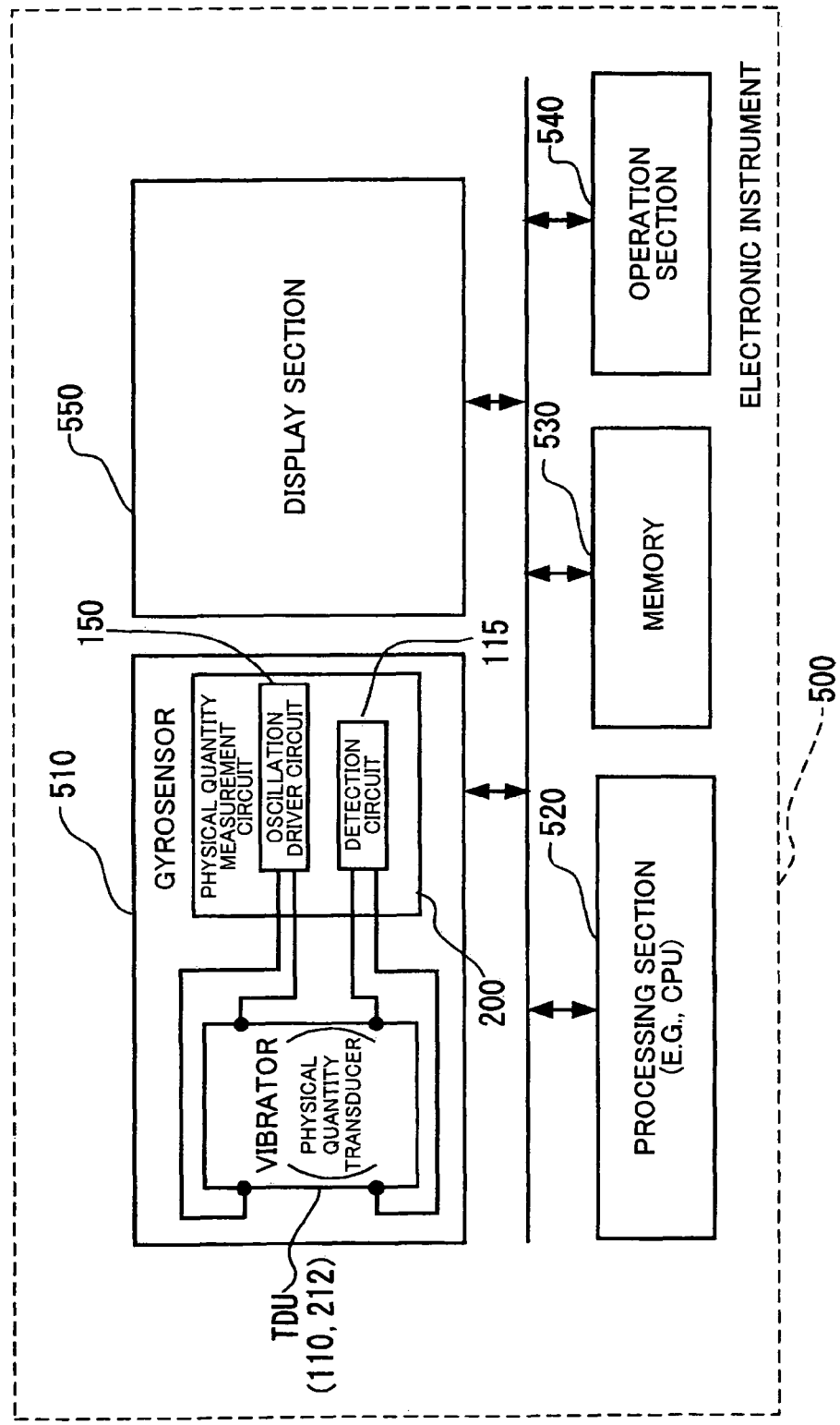
FIG. 10 is a block diagram showing a configuration example of an electronic instrument including a physical quantity measurement device (and a detection circuit) according to the invention.

FIG. 10 is a view showing a configuration example of an electronic instrument including the physical quantity measurement device (and the detection circuit) according to the invention.

The electronic instrument (e.g., digital camera) shown in FIG. 10 includes a gyrosensor (physical quantity measurement device) 510, a display section 550, a processing section 520 such as a CPU, a memory 530, and an operation section 540.

The gyrosensor 510 includes the physical quantity measurement circuit (vibrating gyrosensor circuit) 210 shown in FIGS. 7 to 9. Vibrators (110 and 212) as physical quantity transducers (TDU) are connected to the physical quantity measurement circuit (vibrating gyrosensor circuit) 210.

The physical quantity measurement circuit (vibrating gyrosensor circuit) 210 has been evaluated in advance to have a low-noise performance, for example. Therefore, the physical quantity measurement device (gyrosensor) 510 connected to the physical quantity transducers (TDU) has high accuracy and a high detection performance.

Likewise, an electronic instrument 500 including the physical quantity measurement device (gyrosensor) 510 according to the invention can detect a physical quantity with high accuracy. The performance of the electronic instrument 500 is improved by the invention. The electronic instrument may be a car navigation system, an aircraft, or a robot in addition to the digital camera.

According to the embodiments of the invention, a detection circuit, a physical quantity measurement circuit, and the like can be provided that can evaluate (inspect) a first-stage I/V amplifier of a detection circuit (sensor circuit) with high accuracy and ensure a highly accurate operation during a normal operation state.

Although the invention has been described above based on the embodiments, those skilled in the art would readily appreciate that many modifications are possible in the embodiments without materially departing from the novel teachings and advantages of the invention. For example, the physical quantity measured using the physical quantity transducer is not limited to an angular velocity. The invention may also be applied to an acceleration sensor, an angular acceleration sensor, and the like.

Examples of the material for the physical quantity transducer include a constant modulus alloy such as elinvar and a ferroelectric single crystal (piezoelectric single crystal). Examples of such a single crystal include a rock crystal, lithium niobate, lithium tantalate, a lithium niobate-lithium tantalate solid solution, lithium borate, and langasite. It is preferable that the physical quantity transducer be hermetically sealed in a package. It is preferable that the package be filled with dry nitrogen or be under vacuum.

The invention is useful for a detection circuit, a physical quantity measurement circuit, a physical quantity measurement device (e.g., vibrating gyroscope), and an electronic instrument.

Although only some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention.

What is claimed is:

1. A detection circuit that detects an alternating current signal from a physical quantity transducer that converts a physical quantity into an electrical signal, the detection circuit comprising:

a detection terminal, the alternating current signal from the physical quantity transducer being input to the detection terminal;

a detection current/voltage conversion amplifier circuit that includes a feedback resistor and converts the alternating current signal input through the detection terminal into a voltage signal;

an evaluation terminal that supplies an evaluation voltage signal to the detection current/voltage conversion amplifier circuit;

an input resistor provided in a signal path that connects the evaluation terminal and an input node of the detection current/voltage conversion amplifier circuit, the input resistor having a given resistance ratio with respect to the feedback resistor; and a switch circuit of the detection circuit provided in the signal path that connects the evaluation terminal and the input node of the detection current/voltage conversion amplifier circuit, the switch circuit of the detection circuit electrically connecting the evaluation terminal and the input node of the detection current/voltage conversion amplifier circuit when the evaluation voltage signal is input to the evaluation terminal, and electrically disconnecting the evaluation terminal from the input node of the detection current/voltage conversion amplifier circuit when the alternating current signal is input to the detection terminal.

2. The detection circuit as defined in claim 1,
the detection current/voltage conversion amplifier circuit including a feedback capacitor.

3. The detection circuit as defined in claim 2,
the feedback capacitor and the feedback resistor of the detection current/voltage conversion amplifier circuit being connected in parallel so that the detection current/voltage conversion amplifier circuit has frequency characteristics of a low-pass filter.

4. The detection circuit as defined in claim 1,
the input resistor and the feedback resistor being formed by an identical production step.

5. The detection circuit as defined in claim 1,
the switch circuit of the detection circuit including:
a switch element provided between the evaluation terminal and the input resistor; and
a switch element provided between the input resistor and the input node of the detection current/voltage conversion amplifier circuit.

6. The detection circuit as defined in claim 1,
the detection current/voltage conversion amplifier circuit including a first current/voltage conversion amplifier and a second current/voltage conversion amplifier;
the detection circuit including:
a first detection terminal and a second detection terminal, the alternating current signal being respectively input to the first current/voltage conversion amplifier and the second current/voltage conversion amplifier through the first detection terminal and the second detection terminal; and
a differential amplifier that differentially amplifies signals output from the first current/voltage conversion amplifier and the second current/voltage conversion amplifier; and
the switch circuit of the detection circuit electrically connecting the evaluation terminal and an input node of at least one of the first detection current/voltage conversion amplifier and the second detection current/voltage conversion amplifier when the evaluation voltage signal is input to the evaluation terminal, and electrically disconnecting the evaluation terminal from the input node of the first detection current/voltage conversion amplifier and the second detection current/voltage conversion amplifier when the alternating current signal is input to the detection terminal.

7. The detection circuit as defined in claim 6,
the switch circuit of the detection circuit including:
a switch element provided between the evaluation terminal and the input resistor;

a first switch element provided between the input resistor and the input node of the first current/voltage conversion amplifier; and a second switch element provided between the input resistor and the input node of the second current/voltage conversion amplifier.

8. The detection circuit as defined in claim 1,
the evaluation terminal also serving as an input terminal that receives a signal other than the evaluation voltage signal.

9. A physical quantity measurement circuit that detects an alternating current signal relating to a physical quantity to be measured to measure the physical quantity, the alternating current signal being output from a physical quantity transducer, the physical quantity measurement circuit comprising:
the detection circuit as defined in claim 8; and
an oscillation driver circuit that forms an oscillation loop when the physical quantity transducer is connected to the evaluation terminal, and causing the physical quantity transducer to produce driving vibrations via the oscillation loop.

10. The physical quantity measurement circuit as defined in claim 9,
the oscillation driver circuit including:
a drive current/voltage conversion amplifier circuit that includes a feedback resistor and converts an alternating current signal based on the driving vibrations of the physical quantity transducer input through the evaluation terminal into a voltage signal;
an input resistor provided in a signal path that connects the evaluation terminal and an input node of the drive current/voltage conversion amplifier circuit, the input resistor having a given resistance ratio with respect to the feedback resistor; and
a switch circuit of the oscillation driver circuit provided between the evaluation terminal and the input node of the drive current/voltage conversion amplifier.

11. The physical quantity measurement circuit as defined in claim 10,
the switch circuit of the oscillation driver circuit including:
at least one switch element provided in a first signal path that connects the evaluation terminal and the input node of the drive current/voltage conversion amplifier circuit through the input resistor, the at least one switch element provided in the first signal path electrically connecting the evaluation terminal and the input node of the drive current/voltage conversion amplifier circuit when the evaluation voltage signal is input to the evaluation terminal, and electrically disconnecting the evaluation terminal from the input node of the drive current/voltage conversion amplifier circuit when the alternating current signal based on the driving vibrations is input to the evaluation terminal; and
at least one switch element provided in a second signal path that connects the evaluation terminal and the input node of the drive current/voltage conversion amplifier circuit without passing through the input resistor, the at least one switch element provided in the second signal path electrically disconnecting the evaluation terminal from the input node of the drive current/voltage conversion amplifier circuit when the evaluation voltage signal is input to the evaluation terminal, and electrically connecting the evaluation terminal and the input node of the drive current/voltage conversion amplifier circuit when the alternating current signal based on the driving vibrations is input to the evaluation terminal.

12. The physical quantity measurement circuit as defined in claim 9, the detection circuit including a synchronous detection circuit that is provided in a subsequent stage of the detection current/voltage conversion amplifier circuit and performs a synchronous detection process using a synchronous detection reference signal from the oscillation driver circuit; and when the evaluation voltage signal input to the evaluation terminal is supplied to the input node of the detection current/voltage conversion amplifier circuit through the switch circuit of the detection circuit, the oscillation driver circuit generating the synchronous detection reference signal based on the evaluation voltage signal and supplying the synchronous detection reference signal to the synchronous detection circuit.

13. A physical quantity measurement device comprising:

the physical quantity measurement circuit as defined in claim 9; and at least one physical quantity transducer connected to the physical quantity measurement circuit.

14. The physical quantity measurement device as defined in claim 13, the physical quantity measurement device being a gyrosensor that utilizes a vibrating gyroscope as the physical quantity transducer.

15. An electronic instrument comprising the physical quantity measurement device as defined in claim 13.

16. An electronic instrument comprising the detection circuit as defined in claim 1.

* * * * *